(12) United States Patent
Tsai

(10) Patent No.: US 7,414,861 B2
(45) Date of Patent: Aug. 19, 2008

(54) CIRCUIT BOARD FASTENING STRUCTURE

(75) Inventor: Cheng-Yu Tsai, Taoyuan (TW)

(73) Assignee: Mitac International Corp., Taoyuan (TW)

( * ) Notice: Subject to any disclaimer, the term of this patent is extended or adjusted under 35 U.S.C. 154(b) by 454 days.

(21) Appl. No.: 11/341,480

(22) Filed: Jan. 30, 2006

(65) Prior Publication Data

US 2006/0171134 A1 Aug. 3, 2006

(30) Foreign Application Priority Data

Jan. 31, 2005 (TW) .............................. 94102952 A

(51) Int. Cl.
*H05K 7/02* (2006.01)
*H05K 7/04* (2006.01)
(52) U.S. Cl. ...................... 361/810; 361/679
(58) Field of Classification Search ................ 361/807, 361/810, 679, 688, 704, 748, 784, 785; 439/55, 439/74, 78, 79
See application file for complete search history.

(56) References Cited

U.S. PATENT DOCUMENTS

| | | | | |
|---|---|---|---|---|
| 5,457,608 | A | * | 10/1995 | Scholder et al. ............. 361/759 |
| 5,754,412 | A | | 5/1998 | Clavin |
| 5,833,480 | A | | 11/1998 | Austin |
| 6,071,131 | A | | 6/2000 | Pliml, Jr. |
| 6,693,799 | B2 | * | 2/2004 | Gough et al. ............... 361/758 |
| 6,752,276 | B2 | * | 6/2004 | Rumney .................. 211/41.17 |
| 7,298,609 | B2 | * | 11/2007 | Jeong ......................... 361/683 |

* cited by examiner

*Primary Examiner*—Hung S Bui
(74) *Attorney, Agent, or Firm*—Rabin & Berdo, P.C.

(57) ABSTRACT

A circuit board fastening structure includes a seat, a fastening plate movably mounted onto the seat, and a circuit board. Anchoring members are provided to confine the circuit board. The seat has a detent wall to anchor a detent member located on the fastening plate so that the fastening plate and the circuit board may be coupled and anchored securely.

16 Claims, 6 Drawing Sheets

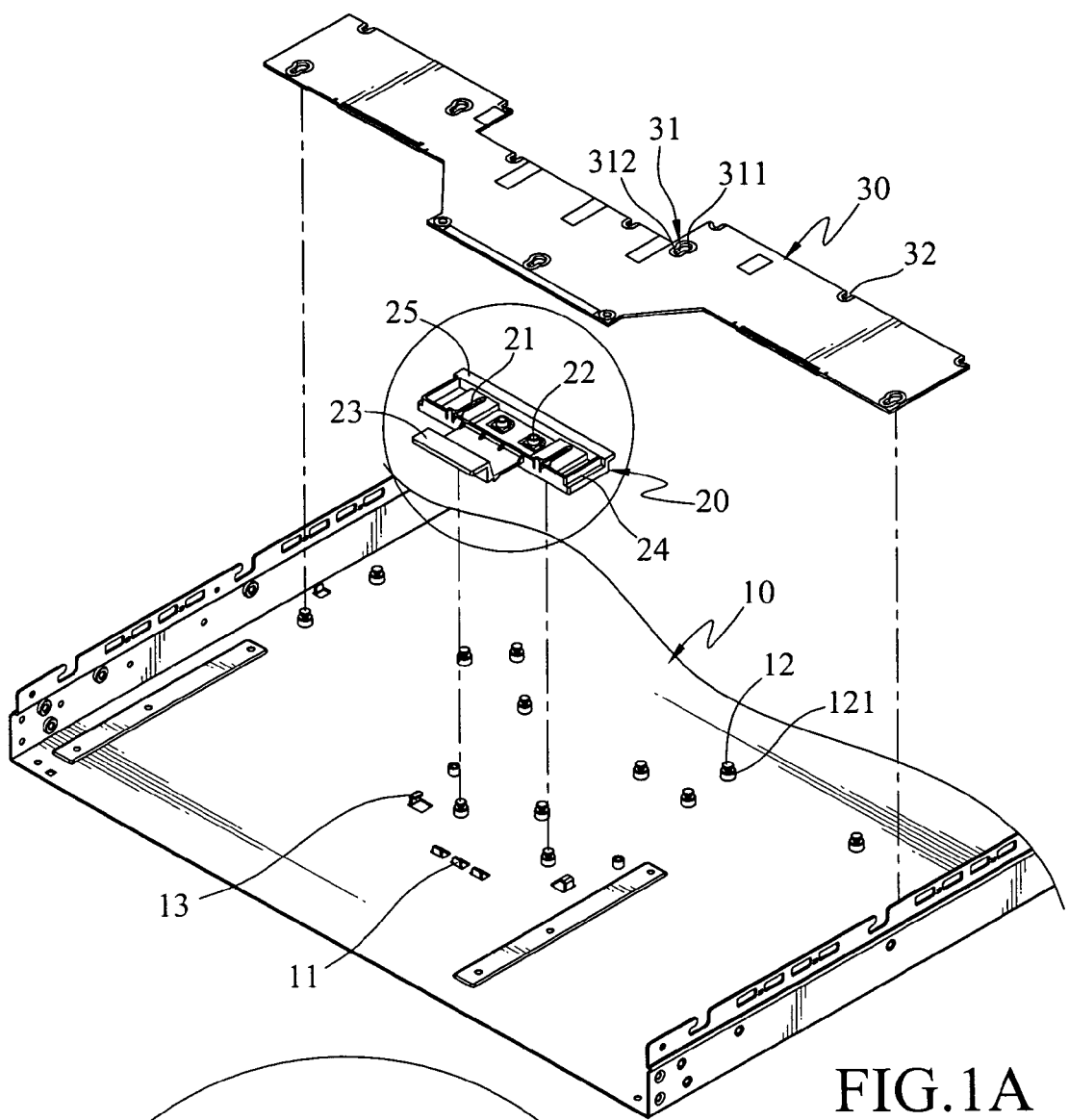
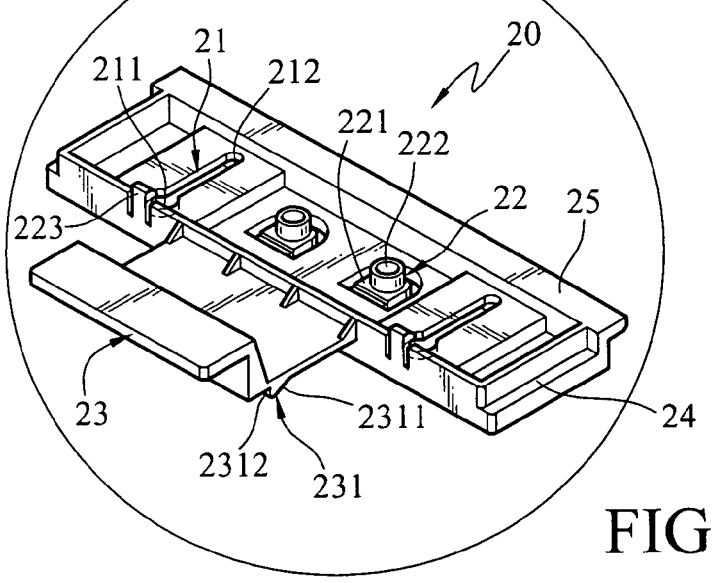
FIG.1A
FIG.1B

CIRCUIT BOARD FASTENING STRUCTURE

CROSS-REFERENCE TO RELATED APPLICATIONS

This non-provisional application claims priority under 35 U.S.C. § 119(a) on Patent Application No(s). 94102952 filed in Taiwan, R.O.C. on Jan. 31, 2005, the entire contents of which are hereby incorporated by reference.

FIELD OF THE INVENTION

The invention relates to a circuit board fastening structure, and particularly to a circuit board fastening structure for mounting a circuit board rapidly and securely without using hand tools.

BACKGROUND OF THE INVENTION

With the rapid development of technology, electronic devices are widely used by people in all walks of life. An electronic device generally includes one or more circuit boards to execute different functions, such as computers, digital cameras, personal digital assistants, personal music players, mobile phones and the like. Now many electronic devices have become household articles for everyday use.

In general, the circuit board is fastened to the chassis of an electronic device with screws. This is the most commonly used approach, but is also the most time-consuming for assembly.

Some alternative methods have been developed to fasten the circuit board to the chassis of the electronic device. For instance, latching elements are commonly used. They are inserted into apertures of the circuit board to brace and anchor the circuit board.

U.S. Pat. Nos. 5,833,480, 5,754,412, and 6,071,131 also disclose related fastening structures. They have at least one bracing portion to hold the circuit board and a latch portion to couple with installation apertures on the circuit board. The bracing portion and the latch portion are spaced at a distance equal to the thickness of the circuit board so that the circuit board can be fastened without shaking.

SUMMARY OF THE INVENTION

The primary object of the invention is to provide a circuit board fastening structure to rapidly and securely fasten a circuit board to the seat of a chassis without using tools.

In order to achieve the foregoing object, the circuit board fastening structure according to the invention includes a seat, a fastening plate and a circuit board. The seat has a jutting detent wall and a plurality of anchoring members. The fastening plate has a plurality of gourd-shaped slots, a flexible detent portion and a detent member. The anchoring members are penetrated through the gourd-shaped slots for movably latching the fastening plate on the anchoring members and the fastening plate is movable on the anchoring members. The flexible detent portion may be detached and coupled with the gourd-shaped slot for preventing the fastening plate from escaping the seat. The detent member is mounted corresponding to the detent wall. The circuit board has a plurality of gourd-shaped openings for being coupled with the anchoring members to latch and allow the circuit board to be moved on the anchoring members. The fastening plate is coupled with one end of the gourd-shaped openings to latch the circuit board. Then the fastening plate is moved until one end of the circuit board is latched by one end of the fastening plate, and the detent member is stopped by the detent wall. Thereby, the fastening plate and the circuit board are coupled securely.

The foregoing, as well as additional objects, features and advantages of the invention will be more readily apparent from the following detailed description, which proceeds with reference to the accompanying drawings.

BRIEF DESCRIPTION OF THE DRAWINGS

FIGS. 1A and 1B are exploded views of the invention.

DESCRIPTION OF THE PREFERRED EMBODIMENT

Figure 2:
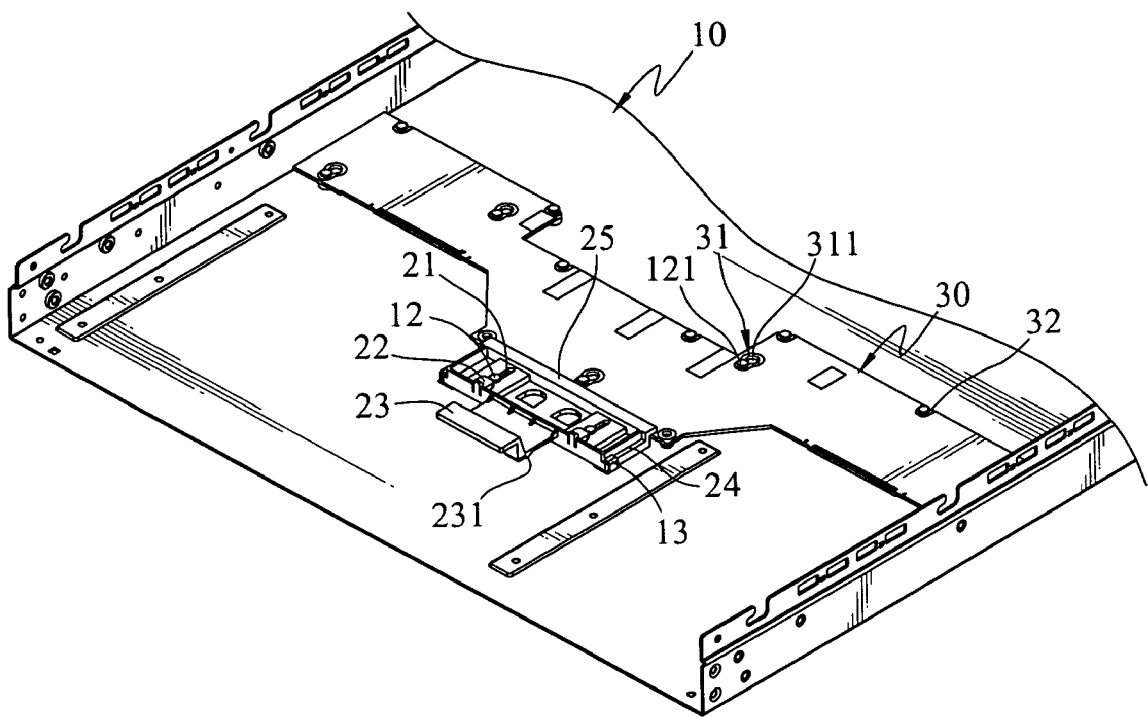
FIG. 2 is a perspective view of the invention.

Referring to FIGS. 1A, 1B and 2, the circuit board fastening structure according to the invention includes a seat 10, a fastening plate 20 and a circuit board 30.

The seat 10 has a jutting detent wall 11, a plurality of anchoring members 12 and guiding tracks 13. The detent wall 11 is formed by a stamping method. Each of the anchoring members 12 has a groove 121 formed at a length at least equal to the thickness of the fastening plate 20 or the circuit board 30. The guiding tracks 13 are formed by a stamping method and opposite to each other for corresponding to two opposite sides of the fastening plate 20.

Figure 3:
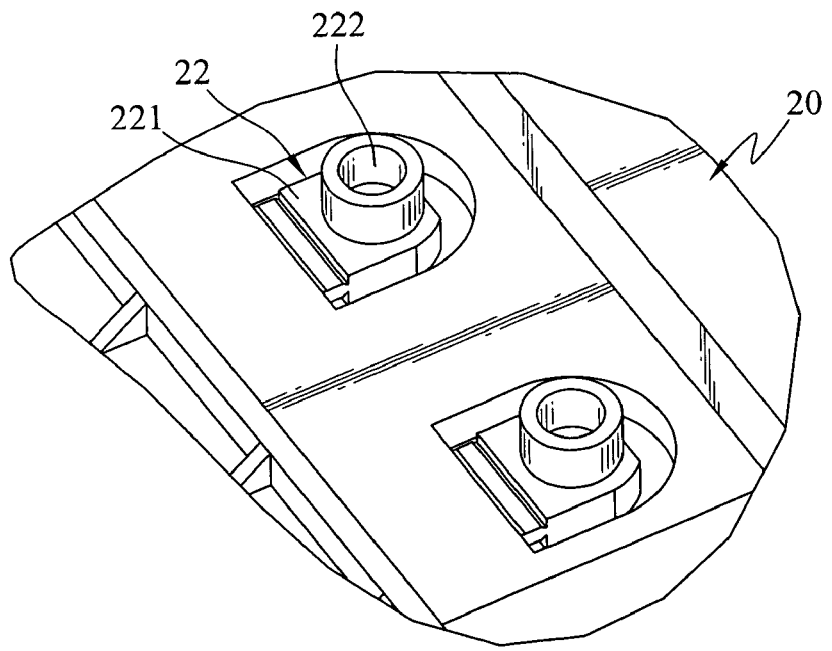
FIG. 3 is a schematic view of the flexible detent portion of the invention.

The fastening plate 20 is made of plastic. It has a plurality of gourd-shaped slots 21 and a flexible detent portion 22, a push portion 23, guiding channels 24 and a buffer member 25 (referring to FIG. 3 for the flexible detent portion).

Each of the gourd-shaped slots 21 includes an aperture 211 and a slit 212. The aperture 211 has a diameter greater than the width of the slit 212. The anchoring member 12 is able to be penetrated through the aperture 211 and moved towards the slit 212, with the groove 121 corresponding to the fastening plate 20 for movably latching the fastening plate 20 on the anchoring member 12, he fastening plate 20 can only be slid on the anchoring members 12.

After the flexible detent portion 22 is bent for locating in the gourd-shaped slot 21 to prevent the fastening plate 20 from escaping the seat 10 after the anchoring member 12 has been penetrated through the gourd-shaped slot 21. This differs from the conventional techniques that have to add a plastic member to hold the fastening plate 20 on the seat 10. Loss of the plastic member can also be avoided. The flexible detent portion 22 includes a bottom plate 221, a boss 222 and a latch hook 223. The boss 222 is mounted corresponding to the aperture 211 and pass through the gourd-shaped slots 21 to keep the bottom plate 221 in contact with the surface of the fastening plate 20. The latch hook 223 can be engaged with the fastening plate 20 to prevent the flexible detent portion 22 from loosing from the fastening plate 20 after installation.

The push portion 23 is provided for receiving a force for moving the fastening plate 20. It has a detent member 231 on a bottom thereof corresponding to the detent wall 11, a sloped surface 2311 and a bucking surface 2312. When the fastening plate 20 is moved and reaches the detent wall 11, the sloped surface 2311 urges the fastening plate 20 to pass over the detent wall 11 so that the bucking surface 2312 is pressed against the detent wall 11 to prevent the fastening plate 20 from moving.

The guiding channels 24 are positioned on two opposite ends of the fastening plate 20 corresponding to the guiding tracks 13 to enable the fastening plate 20 to be moved along the guiding tracks 13.

The buffer member 25 is mounted on one end of the fastening plate 20. It is made of pliable plastic to cushion the impact when the fastening plate 20 is coupled with the circuit board 30.

The circuit board 30 has a plurality of gourd-shaped openings 31 and a plurality of notches 32. Each of the gourd-shaped openings 31 includes a large hole 311 and a small hole 312 connected to each other. The anchoring member 12 can be penetrated through the large hole 311 and is movable towards the small hole 312. The groove 121 corresponds to the circuit board 30. When the circuit board 30 is latched by the anchoring member 12, it can be moved thereon. The notch 32 is formed in a U-shape on the peripheral edges of the circuit board 30 for the anchoring member 12 passing through. When the anchoring member 12 is located in the small hole 312 on one end of the gourd-shaped opening 31, the circuit board 30 is latched. The fastening plate 20 is moved until one end thereof reaches one end of the circuit board 30. The sloped surface 2311 urges the fastening plate 20 to pass over the detent wall 11, and the bucking surface 2312 is pressed against the detent wall 11. Therefore, the fastening plate 20 cannot be moved, and a secured coupling between the fastening plate 20 and the circuit board 30 is formed.

Figure 4A:
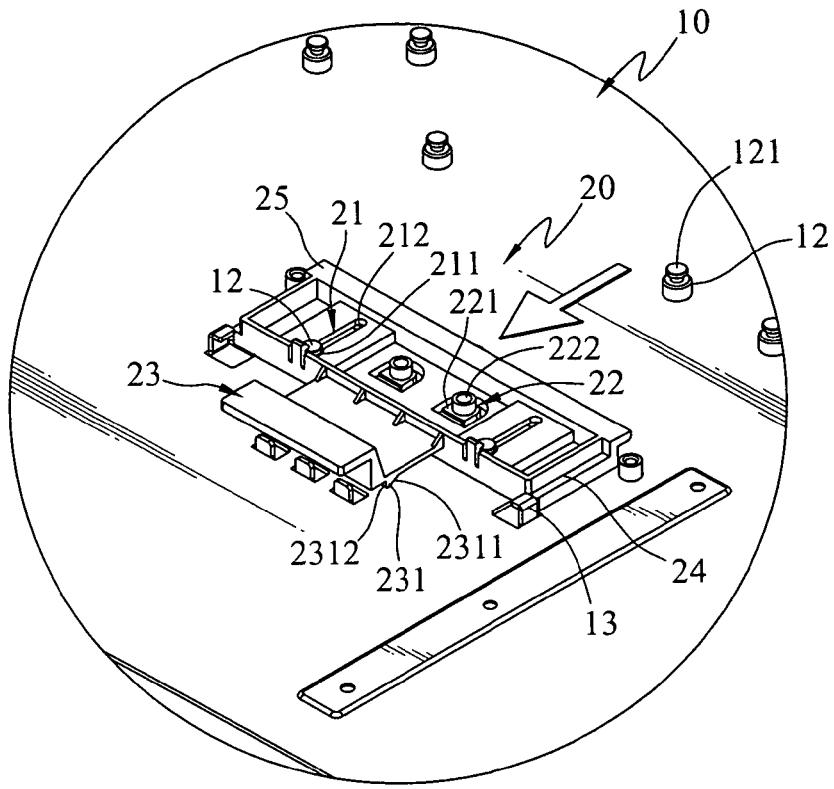
FIGS. 4A through 4G are schematic views of the invention in assembly operations.
Figure 4B:
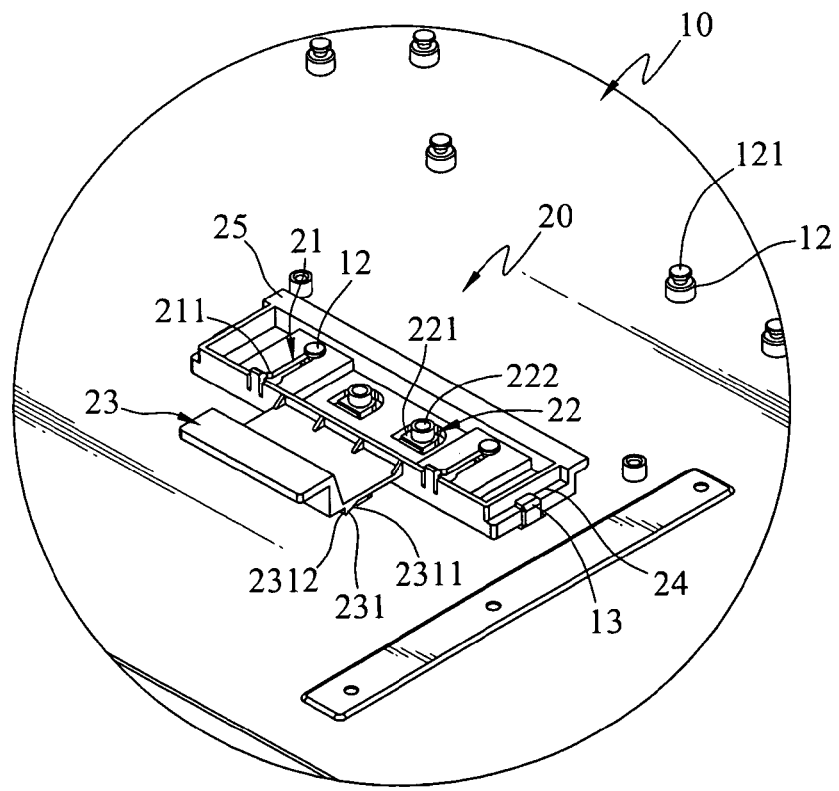
Figure 4C:
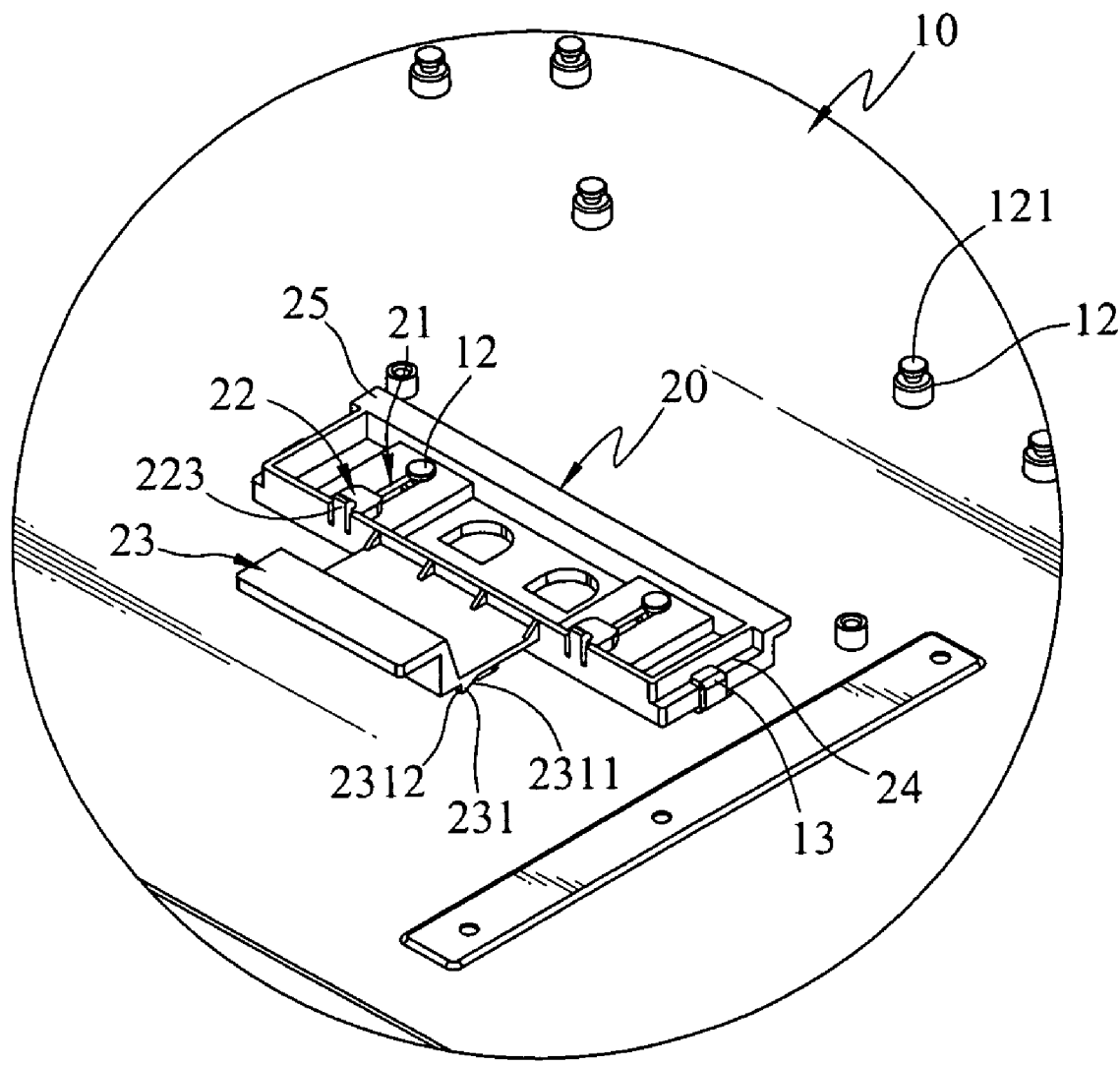
Figure 4D:
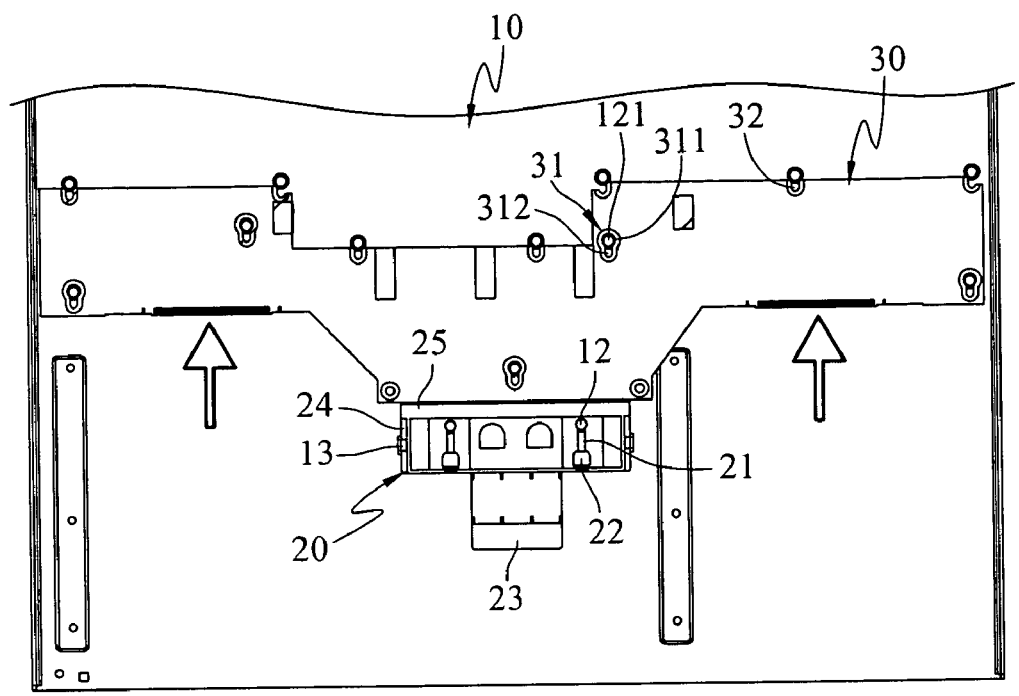
Figure 4E:
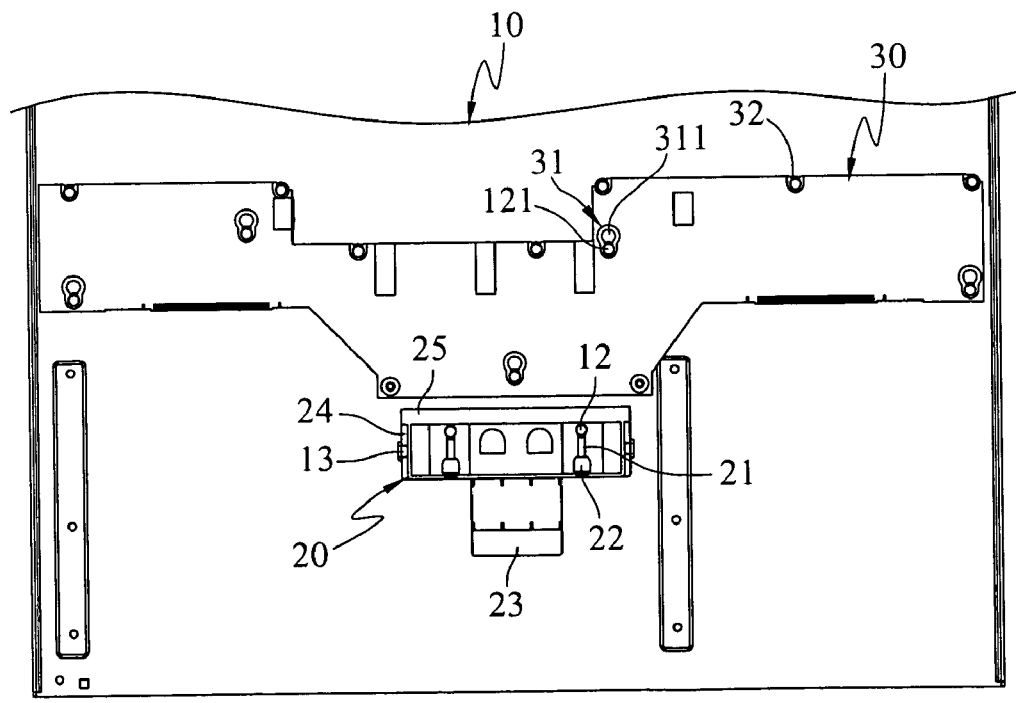
Figure 4F:
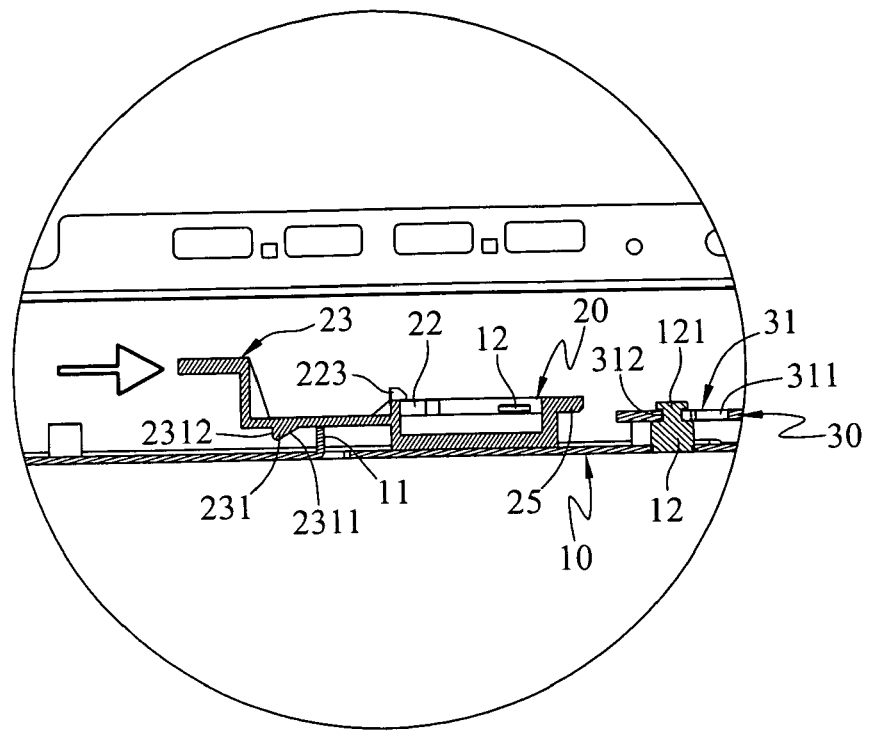
Figure 4G:
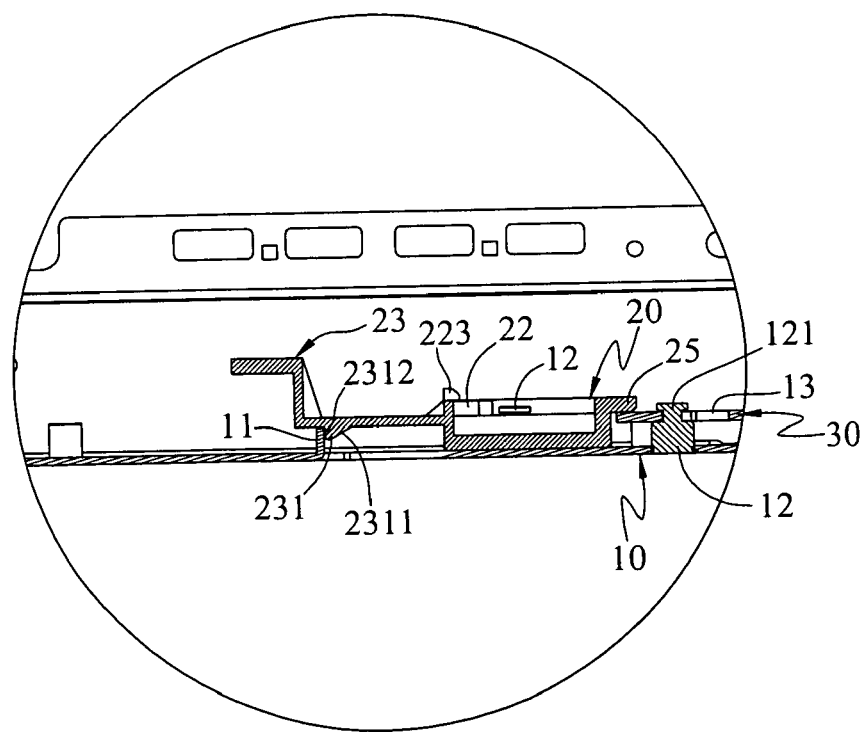

Refer to FIGS. 4A and 4B for assembly operations of the invention. First, penetrate the anchoring member 12 of the seat 10 through the aperture 211 of the gourd-shaped slot 21 of the fastening plate 20; align the guiding channels 24 with the guiding tracks 13 (as shown in FIG. 4A); move the fastening plate 20 slightly towards the groove 121 of the anchoring member 12, with the anchoring member 12 moving away from the aperture 211 (as shown in FIG. 4B); then detach the flexible detent portion 22, insert the boss 222 into the aperture 211, and make the bottom plate 211 in contact with the surface of the fastening plate 20 (as shown in FIG. 4C); the latch hook 223 is engaged with the fastening plate 20 to prevent the flexible detent portion 22 mounted on the fastening plate 20 from loosing; after the anchoring member 12 has been penetrated through the gourd-shaped slot 21, move the push portion 23 so that the anchoring member 12 is coupled with the slit 212 preventing the fastening plate 20 from escaping the seat 10; then couple the large hole 311 of the gourd-shaped opening 31 of the circuit board 30 with the anchoring member 12 of the seat 10, and align the notch 32 with the anchoring member 12 (as shown in FIG. 4D); move the circuit board 30 towards the groove 121 of the anchoring member 12 so that the anchoring member 12 is moved away from the large hole 311 and towards the small hole 312 to latch the circuit board 30 on the anchoring member 12 (as shown in FIG. 4E); move the fastening plate 20 until the buffer member 25 on one end thereof reaches the circuit board 30 (as shown in FIGS. 4F and 4G). In the process previously discussed, the sloped surface 2311 of the detent member 231 urges the fastening plate 20 to pass over the detent wall 11, and the bucking surface 2132 is pressed against the detent wall 11 to prevent the fastening plate 20 from moving. Thus the fastening plate 20 is anchored to form a secure coupling with the circuit board 30.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A circuit board fastening structure, comprising:
    a seat having a jutting detent wall and a plurality of anchoring members;
    a fastening plate having a plurality of gourd-shaped slots, a flexible detent portion and a detent member, wherein the flexible detent portion includes a bottom plate, a boss and a latch hook;
    wherein the anchoring members are penetrated through the gourd-shaped slots for movably latching the fastening plate on the anchoring members, the flexible detent portion is coupled with the gourd-shaped slot for preventing the fastening plate from escaping the seat, and the detent member is mounted corresponding to the detent wall;
    wherein the seat further has two guiding tracks opposite to each other, and the guiding tracks are mounted corresponding to two opposite sides of the fastening plate such that the fastening plate is movable along the guiding tracks;
    wherein the fastening plate has two guiding channels positioned on the two opposite sides of the- fastening plate and corresponding to the guiding tracks;
    a circuit board having a plurality of gourd-shaped openings for coupling with the anchoring members to allow the circuit board to be movably latched on the anchoring members; and
    wherein the anchoring member penetrates through one end of the gourd-shaped opening to latch the circuit board, the fastening plate is movable until one end thereof reaches another end of the circuit board, and the detent member is pressed against the detent wall to form a secure coupling between the fastening plate and the circuit board.

2. The circuit board fastening structure of claim 1, wherein the detent wall is formed by a stamping method.

3. The circuit board fastening structure of claim 1, wherein the anchoring member has a groove.

4. The circuit board fastening structure of claim 3, wherein the groove is formed at a length at least equal to the thickness of the fastening plate.

5. The circuit board fastening structure of claim 3, wherein the groove is formed at a length at least equal to the thickness of the circuit board.

6. The circuit board fastening structure of claim 1, wherein the guiding tracks are formed by a stamping method.

7. The circuit board fastening structure of claim 1, wherein the fastening plate is made of plastic.

8. The circuit board fastening structure of claim 1, wherein each of the gourd-shaped slots comprises an aperture and a slot, and the aperture has a diameter larger than the width of the slot.

9. The circuit board fastening structure of claim 8, wherein the boss is mounted corresponding to the aperture and passes through into the gourd-shaped slot to keep the bottom plate in contact with the surface of the fastening plate, and the latch hook is engaged with the fastening plate to prevent the flexible detent portion from loosing from the fastening plate.

10. The circuit board fastening structure of claim 9, wherein the push portion has a detent member on a bottom thereof.

11. The circuit board fastening structure of claim 1, wherein the fastening plate further has a push portion for receiving a force to move the fastening plate.

12. The circuit board fastening structure of claim 11, wherein the detent member has a sloped surface and a bucking surface.

13. The circuit board fastening structure of claim 12, wherein the buffer member is made of pliable plastic.

14. The circuit board fastening structure of claim 1, wherein the fastening plate has a buffer member on one end thereof.

15. The circuit board fastening structure of claim 1, wherein each of the gourd-shaped openings comprises a large hole and a small hole connected to each other.

16. The circuit board fastening structure of claim 1, wherein the circuit board has a plurality of notches on the peripheral edges thereof.

* * * * *